United States Patent
Esashi et al.

(10) Patent No.: US 7,372,620 B2
(45) Date of Patent: May 13, 2008

(54) MICROMIRROR AND MICROMIRROR DEVICE

(75) Inventors: Masayoshi Esashi, Miyagi (JP); Naoki Kikuchi, Tokyo (JP)

(73) Assignees: Tohoku University, Miyagi (JP); PENTAX Corporation, Tokyo (JP)

( * ) Notice: Subject to any disclaimer, the term of this patent is extended or adjusted under 35 U.S.C. 154(b) by 0 days.

(21) Appl. No.: 11/616,328

(22) Filed: Dec. 27, 2006

(65) Prior Publication Data

US 2007/0177242 A1    Aug. 2, 2007

(30) Foreign Application Priority Data

Dec. 28, 2005    (JP)    ............... 2005-377006

(51) Int. Cl.
*G02B 26/00*    (2006.01)
*G09G 3/34*    (2006.01)

(52) U.S. Cl. .............. 359/295; 359/223; 359/224; 359/290; 359/292; 359/298; 359/316; 359/318; 345/85; 345/108; 348/770; 348/771

(58) Field of Classification Search ........ 359/223–226, 359/290–292, 295, 298, 316, 318; 345/85, 345/108; 348/770, 771
See application file for complete search history.

(56) References Cited

U.S. PATENT DOCUMENTS

| | | | |
|---|---|---|---|
| 5,959,760 A | 9/1999 | Yamada et al. | |
| 6,057,952 A | 5/2000 | Kubo et al. | |
| 6,817,725 B2 * | 11/2004 | Mizuno et al. | 359/224 |
| 6,819,822 B2 | 11/2004 | Behin et al. | |
| 6,995,495 B2 * | 2/2006 | Ko et al. | 359/291 |
| 7,042,621 B2 | 5/2006 | Maeda et al. | |
| 7,088,494 B2 | 8/2006 | Mizuno | |
| 7,116,465 B2 | 10/2006 | Maeda et al. | |
| 7,161,274 B2 * | 1/2007 | Tsuboi et al. | 359/291 |
| 2004/0262507 A1 | 12/2004 | Kikuchi et al. | |
| 2006/0033389 A1 | 2/2006 | Esahi et al. | |
| 2007/0041080 A1 * | 2/2007 | Mizuno et al. | 359/291 |
| 2007/0063614 A1 * | 3/2007 | Tsuboi et al. | 359/290 |

OTHER PUBLICATIONS

U.S. Appl. No. 11/616,433 to Esashi et al., which was filed Dec. 27, 2006.

* cited by examiner

*Primary Examiner*—Evelyn A. Lester
(74) *Attorney, Agent, or Firm*—Greenblum & Bernstein, P.L.C.

(57) ABSTRACT

There is provided a micromirror which includes a holding unit, a mirror that is held by the holding unit to be pivotable about a rotation axis of the mirror, a first fixed electrode group including a plurality of electrodes fixed to the holding unit, a second fixed electrode group including a plurality of electrodes fixed to the holding unit, a first movable electrode group including a plurality of electrodes fixed to the mirror and located adjacently to the first fixed electrode group, and a second movable electrode group including a plurality of electrodes fixed to the mirror and located adjacently to the second fixed electrode group.

11 Claims, 4 Drawing Sheets

MICROMIRROR AND MICROMIRROR DEVICE

BACKGROUND OF THE INVENTION

The present invention relates to a micromirror device configured to tilt a mirror in minute quantity by causing electrostatic attraction between adjacent electrodes.

Recently, various types of micro devices are in practical use with development of MEMS (Micro Electro Mechanical Systems) technology. Among such micro devices is a micromirror winch can be used, for example, as a scanner adapted for a barcode reader, a laser printer, and etc.

U.S. Pat. No. 5,959,760 discloses some types of micromirrors, The micromirror disclosed in this publication is formed to be an electrostatic driving type configured to tilt a mirror in minute amount by electrostatic attraction acting between electrodes. A first example of a micromirror disclosed in U.S. Pat. No. 5,959,760 is configured to locate electrodes (movable electrodes) at both sides of a mirror and to locate fixed electrodes adjacently to the both sides of the mirror.

In the first example, the two fixed electrodes are located at positions slightly upper than a position of the mirror (i.e. positions of the movable electrodes). In order to tilt the mirror, first, only one movable electrode at one side of the mirror is supplied with a voltage. At this time, electric charges of opposite polarities are respectively accumulated on a surface of the movable electrode being supplied with the voltage and a surface of a neighboring fixed electrode. Thus, electrostatic attraction acts between these surfaces of the movable electrode and the fixed electrode. Then, the movable electrode is drawn toward the fixed electrode and thereby the mirror is tilted. If a voltage is applied to the other movable electrode, the mirror tilts in a direction opposed to the above mentioned tilting direction, By alternately applying a voltage to one of the movable electrodes, the mirror swings.

A fifth example of a micromirror disclosed in U.S. Pat. No. 5,959,760 is configured such that one of fixed electrodes is located at a position slightly upper than a position of a mirror and the other fixed electrode is located at a position slightly lower than the position of the mirror. By simultaneously applying a voltage to both the fixed electrodes located adjacently to the sides of the mirror, electrostatic attraction is caused at both of an interval between one of the fixed electrodes and one of the movable electrodes and an interval between the other fixed electrode and the other movable electrode so that the mirror rotates in the same direction. According to the fifth example, a driving force corresponding to the double of the electrostatic attraction caused in the first example can be obtained.

A sixth example of a micromirror disclosed in U.S. Pat. No. 5,959,760 is configured such that, at each side of a mirror, a pair of fixed electrodes is provided so that each side of the mirror is situated in a gap between the pair of fixed electrodes. By applying a voltage to the fixed electrodes as in the case of the fifth example, it is possible to drive the mirror by electrostatic attraction corresponding to the double of the electrostatic attraction generated in the micromirror of the first example. It is also possible to generate electrostatic attraction to rotate the mirror in one of normal rotation and inverse rotation. Furthermore, according to the sixth example, it is possible to tilt the mirror by an angle larger than that achieved in the other examples.

With regard to a micromirror, there is a demand for securing a sufficient tilting angle and a sufficiently strong driving force. As described above, the micromirror in the first example of U.S. Pat. No. 5,959,760 is able to generate the electrostatic attraction enabling the mirror to tilt in both of the directions of normal rotation and inverse rotation. Therefore, according to the first example, a relatively large tilting angle of a mirror can be secured. However, the micromirror of the first example has a drawback that a relatively strong driving force can not be secured because the micromirror generates the electrostatic attraction only at one side of the mirror.

Furthermore, because the electrostatic attraction is generated at one side of the mirror, an unbalanced load may be put on a structural component (e.g., a torsion bar) in the micromirror. Such an unbalanced load may cause the structural component to deform in an unexpected direction, thereby decreasing the durability of the structural component. Since the unbalanced load may also cause loss of energy, the efficiency of conversion from the electrostatic attraction to the rotation of the mirror may be decreased.

As described above, the micromirror in the fifth example of U.S. Pat. No. 5,959,760 is configured to generate the electrostatic attraction at both sides of the mirror to rotate the mirror in the same direction. Therefore, according to the fifth example, a relatively strong driving force can be secured. Since the electrostatic attraction acts symmetrically with respect to a torsion bar in the micromirror, an unbalanced load is not put on the structural component (e.g., the torsion bar) of the micromirror (or an unbalanced load can be decreased).

However, the micromirror of the fifth example has a drawback that it is able to rotate the mirror only in one direction, and therefore a relatively large tilting angle of the mirror can not be secured.

On the other hand, the micromirror in the sixth example of U.S. Pat. No. 5,959,760 is able to secure a relatively large tilting angle of the mirror and a relatively strong driving force. However, since the fixed electrodes need to be positioned on the upper side and the lower side of the movable electrode, the structure of the micromirror becomes considerably complicated, which may reduce production efficiency of micromirrors (i.e., reduce a yield of micromirrors or increase a lead time of production of micromirrors).

SUMMARY OF THE INVENTION

The present invention is advantageous in that it provides at least one of a micromirror and a micromirror device configured to secure a sufficiently large tilting angle of a mirror and a sufficiently strong driving force for moving the mirror while employing a single structure.

According to an aspect of the invention, there is provided a micromirror which includes a holding unit, a mirror that is held by the holding unit to be pivotable about a rotation axis of the mirror, a first fixed electrode group including a plurality of electrodes fixed to the holding unit, a second fixed electrode group including a plurality of electrodes fixed to the holding unit, a first movable electrode group including a plurality of electrodes fixed to the mirror and located adjacently to the first fixed electrode group, and a second movable electrode group including a plurality of electrodes fixed to the mirror and located adjacently to the second fixed electrode group.

In this configuration, the first and second fixed electrode groups are arranged oppositely to each other with respect to the rotation axis of the mirror. The plurality of electrodes of the first movable electrode group includes at least one electrode located at a position upper than that of neighboring one of the plurality of electrodes of the first fixed electrode group, and includes at least one electrode located at a position lower than that of neighboring one of the plurality of electrodes of the first fixed electrode group. Further, the plurality of electrodes of the second movable electrode group includes at least one electrode located at a position upper than that of neighboring one of the plurality of electrodes of the second fixed electrode group, and includes at least one electrode located at a position lower than that of neighboring one of the plurality of electrodes of the second fixed electrode group.

With this configuration, it is possible to generate electrostatic attraction to tilt the mirror in a direction of normal rotation and in a direction of inverse rotation while decreasing the number of electrodes and simplifying the configuration of the micromirror. A sufficient tilting angle of the mirror can be secured. Since such a configuration also makes it possible to generate electrostatic attraction on each of opposed sides of the mirror, a sufficiently strong force for driving the mirror can be secured.

In at least one aspect, a sum of the number of electrodes in the first and second movable electrode groups located at positions upper than those of respective neighboring ones of the first and second fixed electrode groups and the number of electrodes in the first and second fixed electrode groups located at positions upper than those of respective neighboring ones of the first and second movable electrode groups is equal to a sum of the number of electrodes in the first and second movable electrode groups located at positions lower than those of respective neighboring ones of the first and second fixed electrode groups and the number of electrodes in the first and second fixed electrode groups located at positions lower than those of respective neighboring ones of the first and second movable electrode groups.

In at least one aspect, if a first electrode in the first and second movable electrode groups is located at a position lower than that of one of the first and second fixed electrode groups adjacent to the first electrode, a second electrode, which is one of the first and second movable electrode groups and is located oppositely to the first electrode with respect to the rotation axis of the mirror, is located at a position upper than that of one of the first and second fixed electrode groups adjacent to the second electrode.

In at least one aspect, the at least one electrode of the first movable electrode group located at a position upper than that of neighboring one in the first fixed electrode group and the at least one electrode of the second movable electrode group located at a position upper than that of neighboring one in the second fixed electrode group are positioned at a same level.

In at least one aspect, the at least one electrode of the first movable electrode group located at a position lower than that of neighboring one in the first fixed electrode group and the at least one electrode of the second movable electrode group located at a position lower than that of neighboring one in the second fixed electrode group are positioned at a same level.

According to another aspect of the invention, there is provided a micromirror which includes a holding unit, a mirror that is held by the holding unit to be pivotable about a rotation axis of the mirror, a first fixed electrode group including a plurality of electrodes fixed to the holding unit, a second fixed electrode group including a plurality of electrodes fixed to the holding unit, a first movable electrode group including a plurality of electrodes fixed to the mirror and located adjacently to the first fixed electrode group, and a second movable electrode group including a plurality of electrodes fixed to the mirror and located adjacently to the second fixed electrode group. In this configuration, the first and second fixed electrode groups are arranged oppositely to each other with respect to the rotation axis of the mirror. At least one of the first and second movable electrode groups includes two types of electrodes including a first type electrode located at a position upper than that of one of the first and second fixed electrode groups adjacent to the first type electrode and a second type electrode located at a position lower than that of one of the first and second fixed electrode groups adjacent to the second type electrode. Further, in the at least one of the first and second movable electrode groups, the first type electrode and the second type electrode are arranged in a mixed state.

With this configuration, it is possible to generate electrostatic attraction to tilt the mirror in a direction of normal rotation and in a direction of inverse rotation while decreasing the number of electrodes and simplifying the configuration of the micromirror. A sufficient tilting angle of the mirror can be secured, Since such a configuration also makes it possible to generate electrostatic attraction on each of opposed sides of the mirror, a sufficiently strong force for driving the mirror can be secured.

According to another aspect of the invention, there is provided a micromirror device which includes the above mentioned micromirror, and a driving voltage supply unit that supplies a voltage to the micromirror. In order to rotate the mirror in a direction of normal rotation, the driving voltage supply unit supplies a voltage to predetermined ones of the plurality of electrodes selected from the first and second movable electrode groups and the first and second fixed electrode groups so that electrostatic attraction acts between the first movable electrode group and the first fixed electrode group in a first direction, while electrostatic attraction acts between the second movable electrode group and the second fixed electrode group in a second direction which is opposite to the first direction.

With this configuration, it is possible to generate electrostatic attraction to tilt the mirror in a direction of normal rotation and in a direction of inverse rotation while decreasing the number of electrodes and simplifying the configuration of the micromirror. A sufficient tilting angle of the mirror can be secured. Since such a configuration also makes it possible to generate electrostatic attraction on each of opposed sides of the mirror, a sufficiently strong force for driving the mirror can be secured.

In at least one aspect, in order to rotate the mirror in a direction of inverse rotation, the driving voltage supply unit supplies a voltage to ones of the plurality of electrodes in the first and second movable electrode groups and the first and second fixed electrode groups other than the predetermined ones so that electrostatic attraction acts between the first movable electrode group and the first fixed electrode group in the second direction, while electrostatic attraction acts between the second movable electrode group and the second fixed electrode group in the first direction.

According to another aspect of the invention, there is provided a micromirror which includes a micromirror unit, and a supporting unit that holds the micromirror unit. The micromirror unit includes a holding unit, a mirror that is held by the holding unit to be pivotable about a first rotation axis of the mirror, a first fixed electrode group including a plurality of electrodes fixed to the holding unit, a second fixed electrode group including a plurality of electrodes fixed to the holding unit, a first movable electrode group including a plurality of electrodes fixed to the mirror and located adjacently to the first fixed electrode group, and a second movable electrode group including a plurality of electrodes fixed to the mirror and located adjacently to the second fixed electrode group. The first and second fixed electrode groups are arranged oppositely to each other with respect to the first rotation axis of the mirror. The plurality of electrodes of the first movable electrode group includes at least one electrode located at a position upper than that of neighboring one of the plurality of electrodes of the first fixed electrode group, and includes at least one electrode located at a position lower than that of neighboring one of the plurality of electrodes of the first fixed electrode group.

The plurality of electrodes of the second movable electrode group includes at least one electrode located at a position upper than that of neighboring one of the plurality of electrodes of the second fixed electrode group, and includes at least one electrode located at a position lower than that of neighboring one of the plurality of electrodes of the second fixed electrode group. The micromirror unit is held by the supporting unit to be pivotable about a second rotation axis of the mirror.

Further, the micromirror includes a third fixed electrode group including a plurality of electrodes fixed to the supporting unit, a fourth fixed electrode group including a plurality of electrodes fixed to the supporting unit, a third movable electrode group including a plurality of electrodes fixed to the holding unit of the micromirror unit and located adjacently to the third fixed electrode group, and a fourth movable electrode group including a plurality of electrodes fixed to the holding unit of the micromirror unit and located adjacently to the fourth fixed electrode group. In this configuration, the third and fourth fixed electrode groups are arranged oppositely to each other with respect to the second rotation axis of the mirror. The plurality of electrodes of the third movable electrode group includes at least one electrode located at a position upper than that of neighboring one of the plurality of electrodes of the third fixed electrode group, and includes at least one electrode located at a position lower than that of neighboring one of the plurality of electrodes of the third fixed electrode group. The plurality of electrodes of the fourth movable electrode group includes at least one electrode located at a position upper than that of neighboring one of the plurality of electrodes of the fourth fixed electrode group, and includes at least one electrode located at a position lower than that of neighboring one of the plurality of electrodes of the fourth fixed electrode group.

With this configuration, it is possible to generate electrostatic attraction to tilt the mirror in a direction of normal rotation and in a direction of inverse rotation while decreasing the number of electrodes and simplifying the configuration of the micromirror. A sufficient tilting angle of the mirror can be secured. Since such a configuration also makes it possible to generate electrostatic attraction on each of opposed sides of the mirror, a sufficiently strong force for driving the mirror can be secured.

BRIEF DESCRIPTION OF THE ACCOMPANYING DRAWINGS

DETAILED DESCRIPTION OF THE EMBODIMENTS

Hereinafter, embodiments according to the invention are described with reference to the accompanying drawings.

First Embodiment

Figure 1:
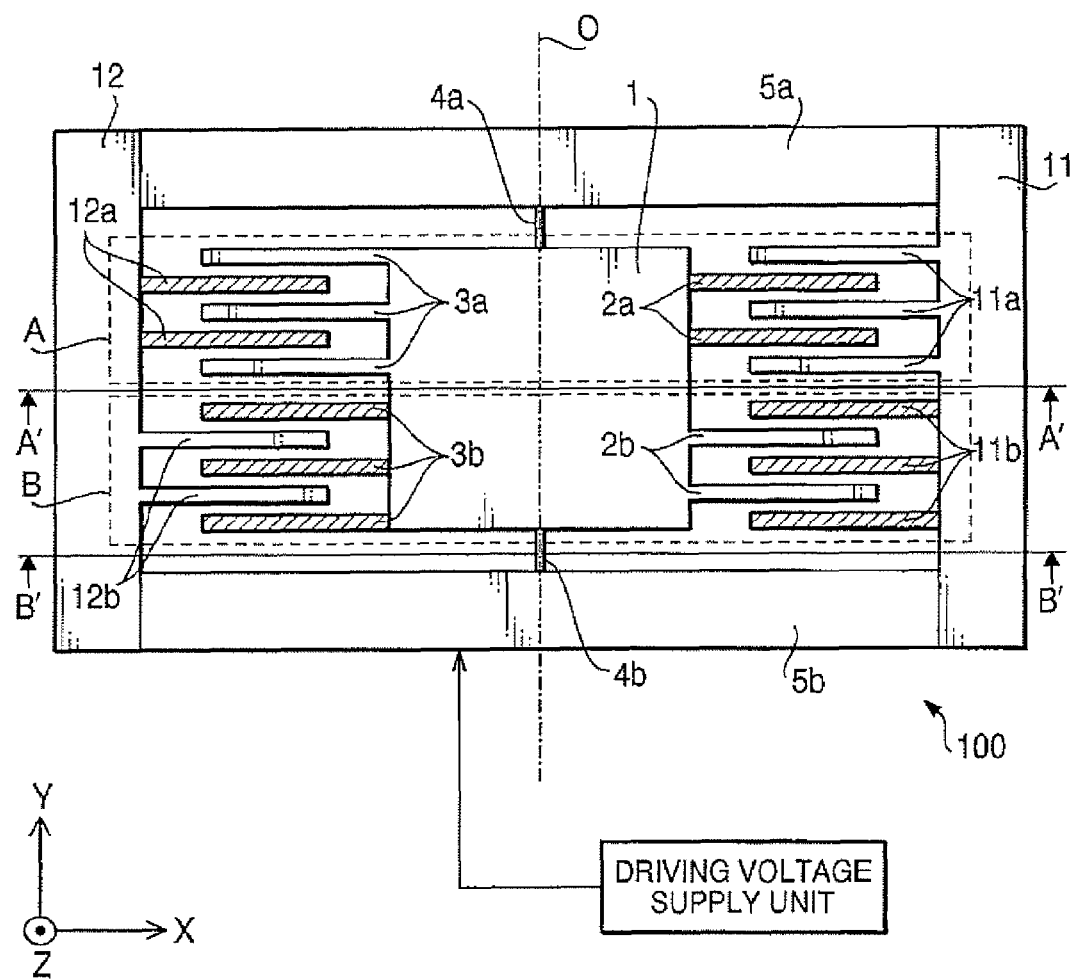
FIG. 1 is a top view of a micromirror according to a first embodiment of the invention.
Figure 2A:
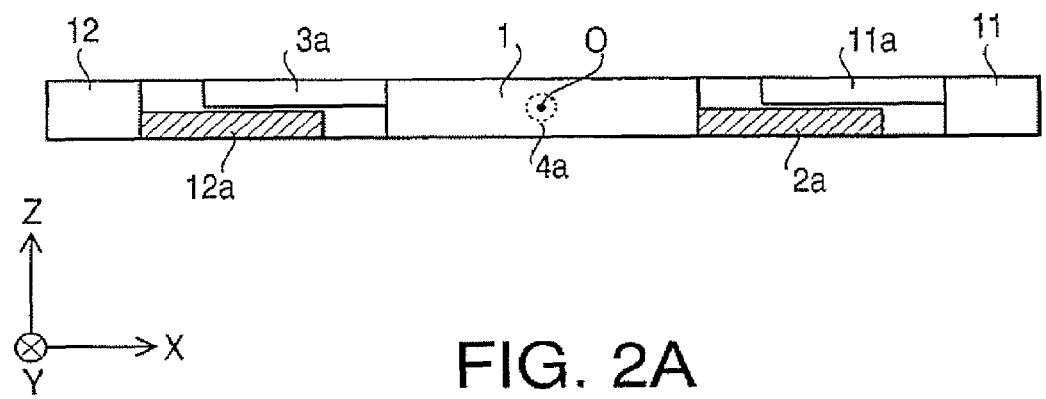
FIG. 2A shows a cross section of the micromirror along a line A'-A' in FIG. 1.
Figure 2B:
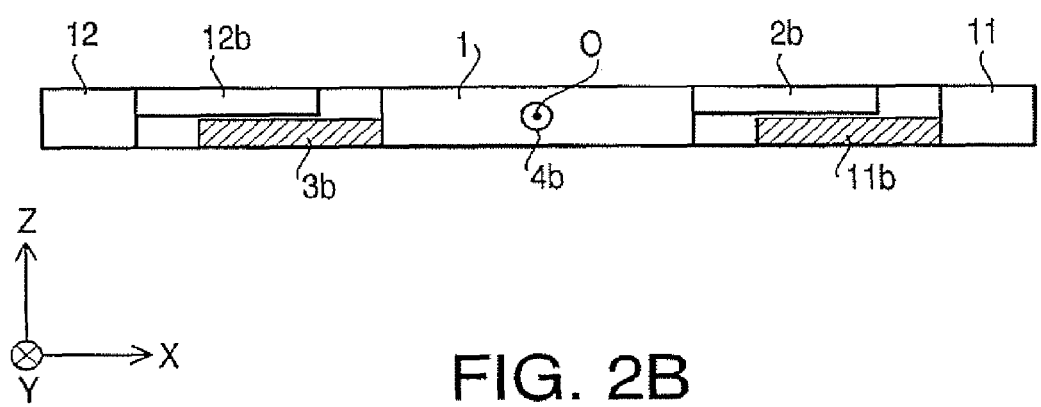
FIG. 2B shows a cross section of the micromirror along a line B'-B' in FIG. 1.

FIG. 1 is a top view of a micromirror 100 according to a first embodiment of the invention. FIG. 2A shows a cross section of the micromirror 100 along a line A'-A' in FIG. 1. FIG. 2B shows a cross section of tie micromirror 100 along a line B'-B' in FIG. 1. The micromirror 100 can be employed in various types of devices such as a barcode reader and a laser printer. The micromirror 100 is mounted on a supporting substrate in these various types of devices. In each of FIGS. 1, 2A and 2B, Cartesian coordinates are defined.

The micromirror 100 includes a mirror 1, a plurality of movable comb-shaped teeth 2a, 2b, 3a and 3b, torsion bars 4a and 4b, and gimbal parts 5a and 5b. These structural components may be formed, for example, on a single conductive silicon substrate. In other words, these structural components are integrated to form a single-piece structure. In each of FIGS. 1, 2A and 2B, parts of the movable comb-shaped teeth are indicated by oblique lines for the purpose of explanations of the micromirror 100, and the oblique lines do not define properties (e.g., sizes, shapes or colors) of the parts having the oblique lines.

A metal film is evaporated on a surface of the mirror 1. The surface on which the metal film is evaporated corresponds to a surface on an X-Y plane, and is frequently referred to as a reflection surface hereafter. In a state where the micromirror 100 is mounted on one of the above mentioned various types of devices, a beam for scanning on an object is incident on the reflection surface of the mirror 1. The beam incident on the reflection surface is reflected from the reflection surface without being substantially attenuated in a predetermined direction. The predetermined direction (i.e., a direction in which the reflected beam proceeds) changes depending on a tilting angle of the minor 1.

It should be noted that although in FIG. 1 the mirror 1 is illustrated to have a rectangular shape, the mirror 1 may be formed to have a different shape (e.g., a circular shape or an elliptical shape).

The plurality of movable comb-shaped teeth 2a, 2b, 3a and 3b are formed to protrude outwardly from each side of the mirror I extending along a Y-axis direction. The movable comb-shaped teeth 2a and 3a are located oppositely to each other with respect to a rotation axis O of the mirror 1. The movable comb-shaped teeth 2b and 3b are also located oppositely to each other with respect to the rotation axis O of the mirror 1. The rotation axis O corresponds to a center axis of the mirror 1, and is parallel with sides of the mirror 1 along the Y-axis and perpendicular to the other sides of the mirror 1 along the X-axis.

The movable comb-shaped teeth are arranged at predetermined intervals, and have the same shape and size. By this structure, it is possible to make a tilting property of the mirror 1 during normal rotation and a tilting property of the mirror 1 during inverse rotation substantially equal to each other. The word tilting property means a property representing a relationship between a tilting angle of the mirror 1 and a voltage applied to the micromirror 100. The tilting property may be represented, for example, by an equation or a graph. If the tilting properties of the mirror 1 in normal rotation and inverse rotation are equal to each other, tilting movement of the mirror 1 during the normal rotation becomes symmetrical with tilting movement of the mirror 1 during the inverse rotation with respect to a position of the mirror 1 (shown in FIG. 1) at a time when no voltage is applied to the mirror 1, assuming that a voltage having constant frequency and amplitude is applied to the mirror 1 both in the normal rotation and in the inverse rotation.

If symmetry between tilting movement of the mirror 1 in the normal rotation and tilting movement of the mirror 1 in the inverse rotation is not required, the movable comb-shaped teeth may have non-identical pitches and non-identical sizes.

The torsion bars 4a and 4b are elongated in the Y-axis direction, and are formed to protrude from opposed sides of the rectangular shape of the mirror 1. Each of the torsion bars 4a and 4b has a form of a round bar having a center axis coinciding with the rotation axis 0, and has a property of being twisted relatively easily by an external force. When the torsion bars 4a and 4b are twisted, the mirror 1 tilts in an X-Z plane. The tilting angle of the mirror 1 varies depending on a twisted amount of each torsion bar (or the strength of an external force acting on the torsion bars 4a and 4b). Ends of the torsion bars 4a and 4b are connected to gimbal parts 5a and 5b, respectively, so that the torsion bars 4a and 4b are formed integrally with the gimbal parts 5a and 5b.

The gimbal parts 5a and 5b are elongated in the X-axis direction, and are fixed to the supporting substrate. The gimbal parts 5a and 5b are formed to be opposed to each other with respect to the mirror 1. The mirror 1, the torsion bars 4a and 4b, and the gimbal parts 5a and 5b are held by the supporting substrate, Hereafter, other portions of the micromirror 100 are explained. In addition to the above mentioned structure, the micromirror 100 includes a gimbal part 11 and a plurality of fixed comb-shaped teeth 11a and 11b. These structural components can also be formed integrally with the single conductive silicone substrate. The gimbal part 11 and the fixed comb-shaped teeth 11a and 11b are insulated from the above mentioned structural components including the gimbal parts 5a and 5b. The fixed comb-shaped teeth 12a and 12b are also insulated from each other.

The gimbal part 11 has a longer side along the Y-axis direction, and is fixed to the above mentioned supporting substrate. Each of the fixed comb-shaped teeth 11a and 11b is formed to protrude from a side of the gimbal part 11 extending along the Y-axis direction. The fixed comb-shaped teeth are arranged to have predetermined pitches equal to those of the movable comb-shaped teeth (2a, 2b) located adjacently thereto. The fixed comb-shaped teeth 11a and 11b have the same shape and size. When viewed as a top view shown in FIG. 17 the fixed comb-shaped teeth 11a and 11b are arranged such that adjacent fixed comb-shaped teeth sandwich one movable comb-shaped tooth or one fixed comb-shaped tooth is sandwiched between adjacent movable comb-shaped teeth. Consequently, gaps respectively formed between the fixed comb-shaped teeth and respective neighboring movable comb-shaped teeth become substantially equal to each other. Furthermore, overlapping areas respectively formed by the fixed comb-shaped teeth and their neighboring movable comb-shaped teeth (i.e., formed by opposed surfaces of the fixed comb-shaped teeth and their neighboring movable comb-shaped teeth) in a side cross-sectional view (see FIGS. 3A and 3B) when the mirror 1 is tilted become substantially equal to each other.

If symmetry between tilting movement of the mirror 1 in the normal rotation and tilting movement of the mirror 1 in the inverse rotation is not required, the fixed comb-shaped teeth 11a and 11b may have non-identical pitches and non-identical sizes.

The micromirror 100 includes a gimbal part 12 and a plurality of fixed comb-shaped teeth 12a and 12b. These structural components can also be formed integrally with the single conductive silicone substrate, The gimbal part 12 and the fixed comb-shaped teeth 12a and 12b are insulated from the above mentioned structural components including the gimbal parts 5a and 5b. The fixed comb-shaped teeth 12a and 12b are also insulated from each other, The gimbal part 12 has a longer side along the Y-axis direction, and is located oppositely to the gimbal part 11 with respect to the mirror 1. The gimbal part. 12 is fixed to the above mentioned supporting substrate. Each of the fixed comb-shaped teeth 12a and 12b is formed to protrude from a side of the gimbal part 12 extending along the Y-axis direction. According to the same reasons described above in regard to the fixed comb-shaped teeth 11a and 11b, structural properties (e.g., pitches, shapes, sizes and positions) of the fixed comb-shaped teeth 12a and 12b are determined. Therefore, overlapping areas respectively formed by the fixed comb-shaped teeth 12a and 12b and their neighboring movable comb-shaped teeth (i.e., formed by opposed surfaces of the fixed comb-shaped teeth and their neighboring movable comb-shaped teeth) in a side cross-sectional view when the mirror 1 is tilted become substantially equal to each other.

A positional relationship between the movable comb-shaped teeth and the fixed comb-shaped teeth will now be explained. Only for the purpose of explanations on the positional relationship between the fixed comb-shaped teeth and the movable comb-shaped teeth, regions A and B are defined in the micromirror 100 (see FIG. 1). As shown in FIG. 2A, in the region A, the fixed comb-shaped teeth 11a are situated on the upper side of the neighboring movable comb-shaped teeth 12a. On the gimbal part 12 side, the fixed comb-shaped teeth 12a are situated on the lower side of the neighboring movable comb-shaped teeth 3a.

As shown in FIG. 2B, in the region B, the fixed comb-shaped teeth 11b are situated on the lower side of the neighboring movable comb-shaped teeth 2b. On the gimbal part 12 side, the fixed comb-shaped teeth 12b are situated on the upper side of the neighboring movable comb-shaped teeth 3b. As shown FIGS. 2A and 2B, when viewed as a side view, the fixed comb-shaped teeth and neighboring movable comb-shaped teeth are located not to overlap with each other in a state where the mirror 1 is in a normal position (i.e., in a state where the mirror 1 is not tilted).

The micromirror 100 is configured such that the movable comb-shaped teeth 2b and 3a, and fixed comb-shaped teeth 11a and 12b are on the same level, and the movable comb-shaped teeth 2a and 3b and the fixed comb-shaped teeth 11b and 12a are on the same level. Furthermore, the mirror 1, the gimbal parts 5a, 5b, 11 and 12 are on the same level. Such a structure makes it possible to decrease the thickness of the micromirror 100.

Since the mirror 1 and the gimbal parts 5a, 5b, 11 and 12 are formed of the silicon substrate having a constant thickness and the movable and fixed comb-shaped teeth are located as described above, it is possible to make the thickness of the entire micromirror 100 and the thickness of the mirror 1 equal to each other.

Figure 3A:
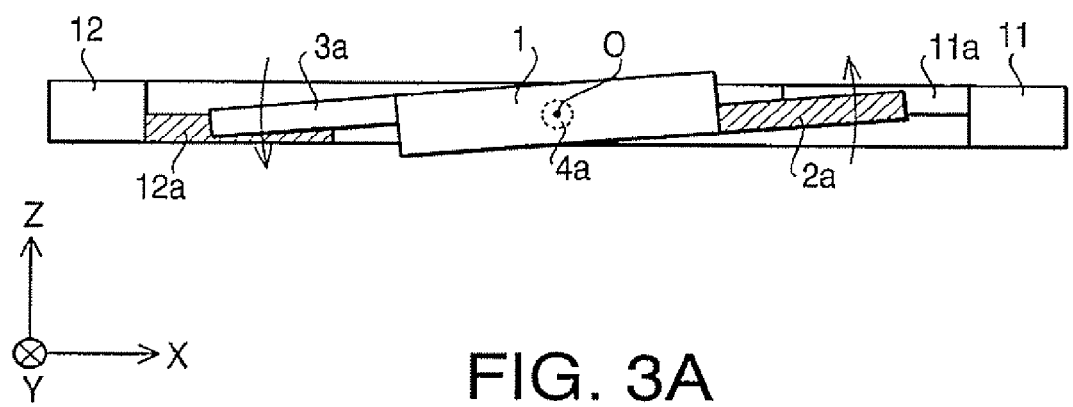
FIG. 3A is a cross section of the micromirror along the line A'-A' in FIG. 1 illustrating a state where a mirror is tilted in a direction of inverse rotation.
Figure 3B:
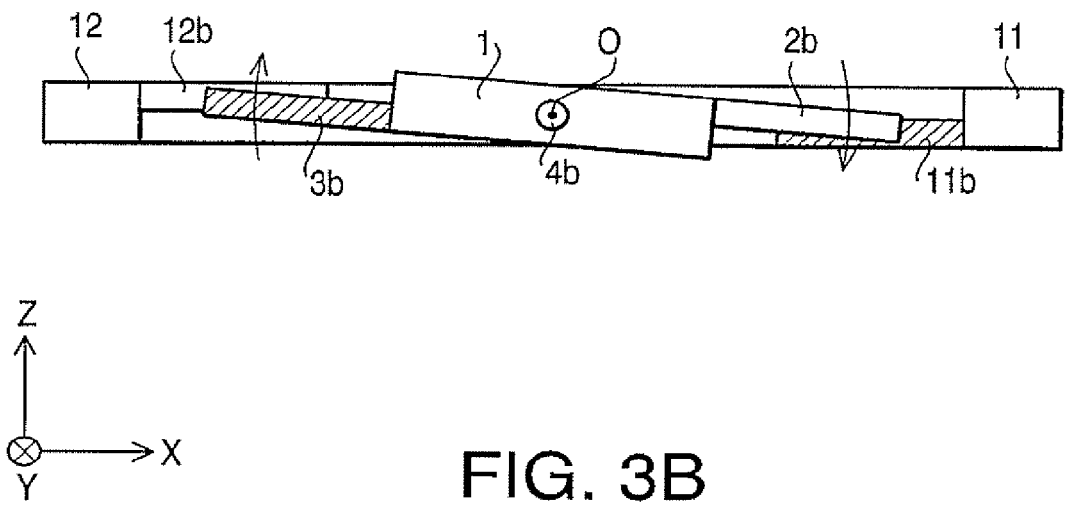
FIG. 3B is a cross section of the micromirror along the line B'-B' in FIG. 1 illustrating a state where the mirror is tilted in a direction of normal rotation.

Hereafter, operations of the micromirror 100 is described. FIG. 3A is a cross section of the micromirror 100 along the line A'-A' in FIG. 1 illustrating a state where the mirror 1 is tilted in a direction of inverse rotation, FIG. 3B is a cross section of the micromirror 100 along the line B'-B' in FIG. 1 illustrating a state where the mirror 1 is tilted in a direction of normal rotation. The micromirror 100 is electrically connected to a driving voltage supply unit to form a circuit together with the driving voltage supply unit.

In order to tilt the mirror 1 in the direction of inverse rotation as shown in FIG. 3A, a predetermined voltage is applied by the driving voltage supply unit between the movable comb-shaped teeth 2a and the fixed comb-shaped teeth 11a, and the same voltage is also applied by the driving voltage supply unit between the movable comb-shaped teeth 3a and the fixed comb-shaped teeth 12a. In this case, for example, the fixed comb-shaped teeth 11a are kept at a voltage $V_1$, the movable comb-shaped teeth 2a are kept at a ground level) the fixed comb-shaped teeth 12a are kept at the voltage $V_1$, and the movable comb-shaped teeth 3a are kept at a ground level.

As a result, electrostatic attraction acts between the fixed comb-shaped teeth 11a and the movable comb-shaped teeth 2a, and electrostatic attraction also acts between the fixed comb-shaped teeth 12a and the movable comb-shaped teeth 3a. By the electrostatic attraction, the movable comb-shaped teeth 2a are drawn upwardly toward the fixed comb-shaped teeth 11a, and the movable comb-shaped teeth 3a are drawn downwardly toward the fixed comb-shaped teeth 12a. That is, a force moving upwardly the mirror 1 acts on the mirror 1 on the gimbal part 11 side, while a force moving downwardly the mirror 1 acts on the mirror 1 on the gimbal part 12 side.

As described above, the mirror 1 is supported by the torsion bars 4a and 4b to be able to freely rotate. Therefore, the above mentioned electrostatic attraction twists the torsion bars 4a and 4b. The twisting of the torsion bars 4a and 4b results in rotation movement of the mirror 1. Consequently, the mirror 1 tilts in the direction of inverse rotation about the rotation axis ) in the X-Z plane.

In order to tilt the mirror 1 in the direction of normal rotation as shown in FIG. 3B, a predetermined voltage is applied by the driving voltage supply unit between the movable comb-shaped teeth 2b and the fixed comb-shaped teeth 11b, and the same voltage is also applied by the driving voltage supply unit between the movable comb-shaped teeth 3b and the fixed comb-shaped teeth 12b. In this case, for example, the fixed comb-shaped teeth 11b are kept at a voltage $V_2$, the movable comb-shaped teeth 2b are kept at a ground level, the fixed comb-shaped teeth 12b are kept at the voltage $V_2$, and the movable comb-shaped teeth 3b are kept at a ground level.

As a result, electrostatic attraction acts between the fixed comb-shaped teeth 11b and the movable comb-shaped teeth 2b, and electrostatic attraction also acts between the fixed comb-shaped teeth 12b and the movable comb-shaped teeth 3b. By the electrostatic attraction, the movable comb-shaped teeth 2b are drawn downwardly toward the fixed comb-shaped teeth 11b, and the movable comb-shaped teeth 3b are drawn upwardly toward the fixed comb-shaped teeth 12b. That is, a force moving downwardly the mirror 1 acts on the mirror on the gimbal part 11 side, while a force moving upwardly the mirror 1 acts on the mirror 1 on the gimbal part 12 side.

The electrostatic attraction moves the mirror 1 to rotate about the rotation axis O in the direction of normal rotation. Consequently, the mirror 1 tilts in the direction of normal rotation about the rotation axis O in the X-Z plane.

In the example shown in FIG. 3A, both of the electrostatic attraction moving the mirror 1 upwardly on the gimbal part 11 side and the electrostatic attraction moving the mirror 1 downwardly on the gimbal part 12 side contribute to the rotation of the mirror 1 in the direction of inverse rotation. In the example shown in FIG. 3B, both of the electrostatic attraction moving the mirror 1 downwardly on the gimbal part 11 side and the electrostatic attraction moving the mirror 1 upwardly on the gimbal part 12 side contribute to the rotation of the mirror 1 in the direction of normal rotation.

That is, on the both sides of the mirror 1, forces act on the mirror 1 to rotate the mirror 1 in the same rotational direction. Therefore, it is possible to rotate the mirror 1 by a sufficiently strong driving force. By securing a sufficiently strong driving force, it is possible to enhance the stability and the response speed of rotation movement of the mirror 1. When the electrostatic attraction is caused between the movable comb-shaped teeth and the fixed comb-shaped teeth, forces having symmetric vectors (i.e., vectors having the same scalar quantity and directions opposed to each other) act at positions which are symmetric with respect to the rotation axis O on the mirror 1.

Therefore, an unbalanced load is not applied to the structural components, particularly to the torsion bars 4a and 4b of the micromirror 100. Strength of forces acting on the micromirror 100 to deform the structural components in unintended directions can be decreased. As a result, the durability of the micromirror 100 can be enhanced. Loss of energy is also decreased. Accordingly, the electrostatic attraction is effectively converted to the rotation movement of the mirror 1. Such a configuration of tie micromirror 100 also makes it possible to lower a driving voltage of the mirror and to reduce power consumption.

As described above, the micromirror 100 is configured such that the mirror 1 can be rotated with respect the normal position, defined when no voltage is applied to the micromirror 100, both in the directions of normal rotation and inverse rotation (see FIG. 1). Such a configuration of the micromirror 100 makes it possible to secure a relatively large tilting angle, and to make tilting angles in the normal rotation and the inverse rotation identical with each other (i.e., to provide a symmetric property for tilting movement of the mirror 1).

The micromirror 100 according to the embodiment is also able to provide easiness of design of an optical system in a device in which the micromirror 100 is to be mounted Since the micromirror 100 has a symmetric property in tilting movement with respect to the normal position of the mirror 1, it is also possible to design an optical system to provide a symmetric property for a scanning range of a beam to be deflected by the mirror 1.

Second Embodiment

Figure 4:
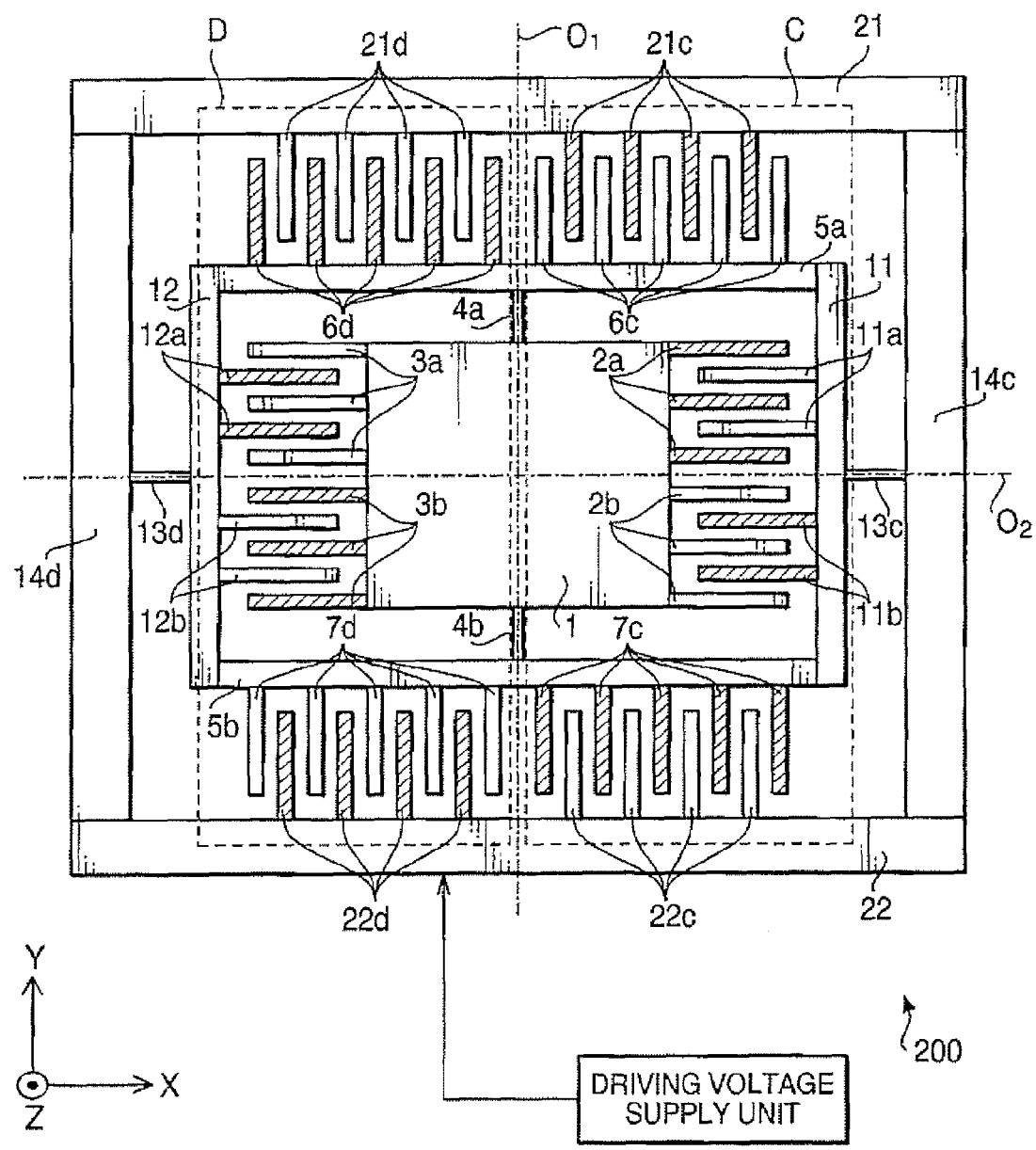
FIG. 4 is a top view of a micromirror according to a second embodiment of the invention.

Hereafter, a micromirror according to a second embodiment of the invention is described. FIG. 4 is a top view of a micromirror 200 according to the second embodiment of the invention. As described above in the first embodiment, the micromirror 100 is the type of scanning device to scan a beam by rotation movement about a single axis. By contrast, the micromirror 200 according to the second embodiment is the type of scanning device to scan a beam by rotation movement about two axes. In FIG. 4, to elements which are substantially the same as those of the first embodiment, the same reference numbers are assigned, and explanations thereof will not be repeated.

The micromirror 200 includes a mirror 1, a plurality of movable comb-shaped teeth 2a, 2b, 3a and 3b, torsion bars 4a and 4b, gimbal parts 5a, 5b, 11 and 12, and a plurality of fixed comb-shaped teeth 11a, 11b, 12a and 12b. As in the case of the micromirror 100, the micromirror 200 is supplied with a voltage from a driving voltage supply source and the mirror 1 of the micromirror 200 rotates about a rotation axis $O_1$ (corresponding to the rotation axis O in the first embodiment) in the X-Z plane. By this structure, a scanning operation about one axis is achieved in the micromirror 200.

To achieve the scanning operation by rotation movement about two axes, the micromirror 200 is provided with movable comb-shaped teeth 6c, 6d, 7c and 7d, torsion bars 13c and 13d, gimbal parts 14c, 14d, 21, and 22, and a plurality of fixed comb-shaped teeth 21c, 21d, 22c, ad 22d.

The movable comb-shaped teeth 6c, 6d, 7c and 7d are formed to protrude outwardly from sides of the gimbal parts 5a and 5b extending along the X-axis. The movable comb-shaped teeth 6c and the movable comb-shaped teeth 7c are located oppositely to each other with respect to a rotation axis $O_2$. The movable comb-shaped teeth 6d and the movable comb-shaped teeth 7d are also located oppositely to each other with respect to the rotation axis $O_2$. These movable comb-shaped teeth are formed to have constant pitches and the same shapes and sizes. The rotation axis $O_2$ corresponds to a line passing the center of the mirror 1 while perpendicularly intersecting with the rotation axis $O_1$. The rotation axis $O_2$ extends in parallel with two of the sides of the mirror 1 along the X-axis and perpendicularly intersects with the other of the sides of the mirror 1.

The torsion bars 13c and 13d are elongated along the X-axis, and are formed to protrude outwardly from the sides of the gimbal parts 11 and 12 extending along the Y-axis. Each of the torsion bars 13c and 13d has a form of a round bar having a center axis coinciding with the rotation axis $O_2$, and has the same property as that of the torsion bars 4a and 4b. The torsion bars 13c and 13d twist easily by an external force, When the torsion bars 13c and 13d twist, the mirror 1 also tilts in the X-Z plane. Ends of the torsion bars 13c and 13d are connected to the gimbal parts 14c and 14d, respectively, so that the torsion bars 13c and 13d are formed integrally with the gimbal parts 14c and 14d, respectively The gimbal parts 14c and 14d are elongated along the Y-axis, and is held by the supporting substrate. The gimbal parts 14c and 14d are located oppositely to each other with respect to the rotation axis $O_1$. The above mentioned structural components are supported by the supporting substrate via the gimbal parts 14c and 14d.

The gimbal parts 21 22 are elongated along the X-axis, and are supported on the supporting substrate. The gimbal parts 21 and 22 are insulated from the above mentioned structural components including the gimbal parts 14c and 14d. The gimbal parts 21 and 22 are also insulated from each other The fixed comb-shaped teeth 21c and 21d are also insulated form each other. The fixed comb-shaped teeth 22c and 22d are also insulated form each other.

The fixed comb-shaped teeth 21c and 21d are formed to protrude inwardly from a side of the gimbal part 21 extending along the X-axis. The fixed comb-shaped teeth 22c and 22d are formed to protrude inwardly from a side of the gimbal part 22 extending along the X-axis. These fixed comb-shaped teeth are located to have the same pitches as those of the neighboring movable comb-shaped teeth (6c, 6d, 7c, and 7d). These fixed comb-shaped teeth (21c, 21d, 22cand 22d) have the same shapes and sizes.

The fixed comb-shaped teeth (21c, 21d, 22c and 22d) are located such that one movable comb-shaped tooth gets caught in a gap between neighboring ones of the fixed comb-shaped teeth or one fixed comb-shaped tooth gets caught in neighboring ones of the movable comb-shaped teeth (6c, 6d, 7c, and 7d). Consequently, gaps respectively formed between the fixed comb-shaped teeth and respective neighboring movable comb-shaped teeth become substantially equal to each other.

A positional relationship between the movable comb-shaped teeth and the fixed comb-shaped teeth will now be explained. As in the case of the first embodiment, neighboring ones of the movable and fixed comb-shaped teeth in the micromirror 200 have different heights. Only for the purpose of explanation on the relationship, regions C and D are defined in the micromirror 200 as shown in FIG. 4.

In the region C, the fixed comb-shaped teeth 21c are located at a lower position than the position of the neighboring movable comb-shaped teeth 6c. On the gimbal part 22 side, the fixed comb-shaped teeth 22c are located at an upper position than the position of the neighboring movable comb-shaped teeth 7c.

In the region D, the fixed comb-shaped teeth 21d are located at an upper position than the position of the neighboring movable comb-shaped teeth 6d. On the gimbal part 22 side, the fixed comb-shaped teeth 22d are located at a lower position than the position of the neighboring movable comb-shaped teeth 7d.

As in the case of the first embodiment, the movable comb-shaped teeth 2b and 3a and the fixed comb-shaped teeth 11a and 12b are positioned at the same level, and the movable comb-shaped teeth 6c and 7d and the fixed comb-shaped teeth 21d and 22c (teeth not indicated by oblique lines) are also located at the same level at which the comb-shaped teeth 2b, 3a, 11a and 12b are positioned.

Further, the movable comb-shaped teeth 2a and 3b and the fixed comb-shaped teeth 11b and 12a are positioned at the same level, and the movable comb-shaped teeth 6d and 7c and the fixed comb-shaped teeth 21c and 22d (i.e., the teeth indicated by oblique lines) are also located at the same level at which the comb-shaped teeth 2a, 3b, 11b and 12a are positioned. With this structure, the mirror 1, the gimbal parts 5a, 5b; 11, 12, 14c, 14d, 21 and 22 can be positioned at the same level. Consequently, the thickness of the entire micromirror 200 can be decreased.

Operations of the micromirror 200 will now be described. The micromirror 200 is electrically connected to the driving voltage supply unit to form a circuit together with the driving voltage supply unit. Similarly to the first embodiment, in order to rotate the minor 1 in the direction of normal rotation or inverse rotation about the rotation axis $O_1$ in the X-Z plane, a predetermined voltage is applied by the driving voltage supply unit between the movable comb-shaped teeth (2a or 2b) and the fixed comb-shaped teeth (11a 11b) and between the movable comb-shaped teeth (3a or 3b) and the fixed comb-shaped teeth (12a 12b).

In order to rotate the mirror 1 in the direction of inverse rotation about the rotation axis $O_2$ in the Y-Z plane, a predetermined voltage is applied by the driving voltage supply unit between the movable comb-shaped teeth 6c and the fixed comb-shaped teeth 21c, and the same voltage is also applied between the movable comb-shaped teeth 7c and the fixed comb-shaped teeth 22c. As a result, electrostatic attraction acts between the movable comb-shaped teeth 6c and the fixed comb-shaped teeth 21c and between the movable comb-shaped teeth 7c and the fixed comb-shaped teeth 22c. In this case, a force drawing the mirror 1 downwardly acts on the mirror 1 on the gimbal part 21 side, while a force drawing the mirror 1 upwardly acts on the mirror 1 on the gimbal part 22 side. Consequently, the mirror 1 tilts in the direction of inverse rotation in the Y-Z plane.

In order to rotate the mirror 1 in the direction of normal rotation about the rotation axis $O_2$ in the Y-Z plane, a predetermined voltage is applied by the driving voltage supply unit between the movable comb-shaped teeth 6d and the fixed comb-shaped teeth 21d, and the same voltage is also applied between the movable comb-shaped teeth 7d and the fixed comb-shaped teeth 22d. As a result, electrostatic attraction acts between the movable comb-shaped teeth 6d and the fixed comb-shaped teeth 21d and between the movable comb-shaped teeth 7d and the fixed comb-shaped teeth 22d. In this case, a force drawing the mirror 1 upwardly acts on the mirror 1 on the gimbal part 21 side, while a force drawing the mirror 1 downwardly acts on the mirror 1 on the gimbal part 22 side, Consequently, the mirror 1 tilts in the direction of normal rotation in the Y-Z plane.

By thus applying a voltage between the movable comb-shaped teeth and the fixed comb-shaped teeth, the mirror 1 is able to tilt in one of the directions of normal rotation and inverse rotation. That is, in the micromirror 200, the mirror 1 is able to tilt about two axes. Therefore, the micromirror 200 is able to perform a two axes scanning operation.

Although the present invention has been described in considerable detail with reference to certain preferred embodiments thereof, other embodiments are possible.

For example, it is understood that the number of comb-shaped teeth provided in the micromirror may be changed.

In the above mentioned embodiments, the comb-shaped teeth are arranged so that the comb-shaped teeth are grouped into two or four regions. However, various types of manners for arranging the comb-shaped teeth can be employed. For example, the comb-shaped teeth may be arranged to be grouped into more minutely divided regions. In this case, it is possible to uniformly arrange two types of regions including the type for rotating the mirror in normal rotation and the type for rotating the mirror in inverse direction on the micromirror. Therefore, stability in rotation movement of the mirror 1 can be enhanced and thereby loss of energy can be decreased.

This application claims priority of Japanese Patent Application No. P2005-377006, filed on Dec. 28, 2005. The entire subject matter of the applications is incorporated herein by reference.

What is claimed is:

1. A micromirror, comprising:
a holding unit;
a mirror that is held by the holding unit to be pivotable about a rotation axis of the mirror;
a first fixed electrode group including a plurality of electrodes fixed to the holding unit;
a second fixed electrode group including a plurality of electrodes fixed to the holding unit;
a first movable electrode group including a plurality of electrodes fixed to the mirror and located adjacently to the first fixed electrode group; and
a second movable electrode group including a plurality of electrodes fixed to the mirror and located adjacently to the second fixed electrode group;
wherein the first and second fixed electrode groups are arranged oppositely to each other with respect to the rotation axis of the mirror,
wherein the plurality of electrodes of the first movable electrode group includes at least one electrode located at a position upper than that of neighboring one of the plurality of electrodes of the first fixed electrode group, and includes at least one electrode located at a position lower than that of neighboring one of the plurality of electrodes of the first fixed electrode group,
wherein the plurality of electrodes of the second movable electrode group includes at least one electrode located at a position upper than that of neighboring one of the plurality of electrodes of the second fixed electrode group, and includes at least one electrode located at a position lower than that of neighboring one of the plurality of electrodes of the second fixed electrode group.

2. The micromirror according to claim 1, wherein a sum of the number of electrodes in the first and second movable electrode groups located at positions upper than those of respective neighboring ones of the first and second fixed electrode groups and the number of electrodes in the first and second fixed electrode groups located at positions upper than those of respective neighboring ones of the first and second movable electrode groups is equal to a sum of the number of electrodes in the first and second movable electrode groups located at positions lower than those of respective neighboring ones of the first and second fixed electrode groups and the number of electrodes in the first and second fixed electrode groups located at positions lower than those of respective neighboring ones of the first and second movable electrode groups.

3. The micromirror according to claim 1, wherein if a first electrode in the first and second movable electrode groups is located at a position lower than that of one of the first and second fixed electrode groups adjacent to the first electrode, a second electrode, which is one of the first and second movable electrode groups and is located oppositely to the first electrode with respect to the rotation axis of the mirror, is located at a position upper than that of one of the first and second fixed electrode groups adjacent to the second electrode.

4. The micromirror according to claim 1, wherein the at least one electrode of the first movable electrode group located at a position upper than that of neighboring one in the first fixed electrode group and the at least one electrode of the second movable electrode group located at a position upper than that of neighboring one in the second fixed electrode group are positioned at a same level.

5. The micromirror according to claim 1, wherein the at least one electrode of the first movable electrode group located at a position lower than that of neighboring one in the first fixed electrode group and the at least one electrode of the second movable electrode group located at a position lower than that of neighboring one in the second fixed electrode group are positioned at a same level.

6. A micromirror device, comprising:
a micromirror according to claim 1; and
a driving voltage supply unit that supplies a voltage to the micromirror,
wherein in order to rotate the mirror in a direction of normal rotation, the driving voltage supply unit supplies a voltage to predetermined ones of the plurality of electrodes selected from the first and second movable electrode groups and the first and second fixed electrode groups so that electrostatic attraction acts between the first movable electrode group and the first fixed electrode group in a first direction, while electrostatic attraction acts between the second movable electrode group and the second fixed electrode group in a second direction which is opposite to the first direction.

7. The micromirror device according to claim 6, wherein in order to rotate the mirror in a direction of inverse rotation, the driving voltage supply unit supplies a voltage to ones of the plurality of electrodes in the first and second movable electrode groups and the first and second fixed electrode groups other than the predetermined ones so that electrostatic attraction acts between the first movable electrode group and the first fixed electrode group in the second direction, while electrostatic attraction acts between the second movable electrode group and the second fixed electrode group in the first direction.

8. A micromirror, comprising:
a holding unit;
a mirror that is held by the holding unit to be pivotable about a rotation axis of the mirror;
a first fixed electrode group including a plurality of electrodes fixed to the holding unit;
a second fixed electrode group including a plurality of electrodes fixed to the holding unit;
a first movable electrode group including a plurality of electrodes fixed to the mirror and located adjacently to the first fixed electrode group; and
a second movable electrode group including a plurality of electrodes fixed to the mirror and located adjacently to the second fixed electrode group;
wherein the first and second fixed electrode groups are arranged oppositely to each other with respect to the rotation axis of the mirror,
wherein at least one of the first and second movable electrode groups includes two types of electrodes including a first type electrode located at a position upper than that of one of the first and second fixed electrode groups adjacent to the first type electrode and a second type electrode located at a position lower than that of one of the first and second fixed electrode groups adjacent to the second type electrode, wherein in the at least one of the first and second movable electrode groups, the first type electrode and the second type electrode are arranged in a mixed state.

9. A micromirror device, comprising:
a micromirror according to claim 8; and
a driving voltage supply unit that supplies a voltage to the micromirror,
wherein in order to rotate the mirror in a direction of normal rotation, the driving voltage supply unit supplies a voltage to predetermined ones of the plurality of electrodes selected from the first and second movable electrode groups and the first and second fixed electrode groups so that electrostatic attraction acts between the first movable electrode group and the first fixed electrode group in a first direction, while electrostatic attraction acts between the second movable electrode group and the second fixed electrode group in a second direction which is opposite to the first direction.

10. The micromirror device according to claim 9, wherein in order to rotate the mirror in a direction of inverse rotation, the driving voltage supply unit supplies a voltage to ones of the plurality of electrodes in the first and second movable electrode groups and the first and second fixed electrode groups other than the predetermined ones so that electrostatic attraction acts between the first movable electrode group and the first fixed electrode group in the second direction, while electrostatic attraction acts between the second movable electrode group and the second fixed electrode group in the first direction.

11. A micromirror, comprising:
a micromirror unit; and
a supporting unit that holds the micromirror unit, wherein the micromirror unit comprises:
a holding unit;
a mirror that is held by the holding unit to be pivotable about a first rotation axis of the mirror;
a first fixed electrode group including a plurality of electrodes fixed to the holding unit;
a second fixed electrode group including a plurality of electrodes fixed to the holding unit;
a first movable electrode group including a plurality of electrodes fixed to the mirror and located adjacently to the first fixed electrode group; and
a second movable electrode group including a plurality of electrodes fixed to the mirror and located adjacently to the second fixed electrode group;
wherein the first and second fixed electrode groups are arranged oppositely to each other with respect to the first rotation axis of the mirror, wherein the plurality of electrodes of the first movable electrode group includes at least one electrode located at a position upper than that of neighboring one of the plurality of electrodes of the first fixed electrode group, and includes at least one electrode located at a position lower than that of neighboring one of the plurality of electrodes of the first fixed electrode group, wherein the plurality of electrodes of the second movable electrode group includes at least one electrode located at a position upper than that of neighboring one of the plurality of electrodes of the second fixed electrode group, and includes at least one electrode located at a position lower than that of neighboring one of the plurality of electrodes of the second fixed electrode group, wherein the micromirror unit is held by the supporting unit to be pivotable about a second rotation axis of the mirror;

the micromirror further comprising:
a third fixed electrode group including a plurality of electrodes fixed to the supporting unit;
a fourth fixed electrode group including a plurality of electrodes fixed to the supporting unit;
a third movable electrode group including a plurality of electrodes fixed to the holding unit of the micromirror unit and located adjacently to the third fixed electrode group; and
a fourth movable electrode group including a plurality of electrodes fixed to the holding unit of the micromirror unit and located adjacently to the fourth fixed electrode group;
wherein the third and fourth fixed electrode groups are arranged oppositely to each other with respect to the second rotation axis of the mirror, wherein the plurality of electrodes of the third movable electrode group includes at least one electrode located at a position upper than that of neighboring one of the plurality of electrodes of the third fixed electrode group, and includes at least one electrode located at a position lower than that of neighboring one of the plurality of electrodes of the third fixed electrode group, wherein the plurality of electrodes of the fourth movable electrode group includes at least one electrode located at a position upper than that of neighboring one of the plurality of electrodes of the fourth fixed electrode group, and includes at least one electrode located at a position lower than that of neighboring one of the plurality of electrodes of the fourth fixed electrode group.

* * * * *